United States Patent [19]

Lee

[11] Patent Number: 5,740,107
[45] Date of Patent: Apr. 14, 1998

[54] NONVOLATILE INTEGRATED CIRCUIT MEMORIES HAVING SEPARATE READ/WRITE PATHS

[75] Inventor: Seung-Keun Lee, Seoul, Rep. of Korea

[73] Assignee: Samsung Electronics Co., Ltd., Suwon, Rep. of Korea

[21] Appl. No.: 653,344

[22] Filed: May 24, 1996

[30] Foreign Application Priority Data

May 27, 1995 [KR] Rep. of Korea ............ 1995/13571

[51] Int. Cl.[6] ...................................... G11C 7/00
[52] U.S. Cl. .................. 365/185.11; 365/51; 365/63; 365/185.17; 365/185.23; 365/189.01
[58] Field of Search ................ 365/189.01, 51, 365/63, 185.11, 185.05, 185.23, 185.17, 189.04

[56] References Cited

U.S. PATENT DOCUMENTS

| | | | |
|---|---|---|---|
| 5,276,837 | 1/1994 | Sakaue | 365/189.04 X |
| 5,299,158 | 3/1994 | Mason et al. | 365/189.04 |
| 5,473,563 | 12/1995 | Suh et al. | 365/185.13 |
| 5,477,500 | 12/1995 | Iwahashi | 365/185.11 X |
| 5,568,420 | 10/1996 | Lim et al. | 365/185.11 X |
| 5,568,421 | 10/1996 | Aritome | 365/185.11 X |
| 5,590,087 | 12/1996 | Chung et al. | 365/189.04 X |

*Primary Examiner*—Do Hyun Yoo
*Attorney, Agent, or Firm*—Myers Bigel Sibley & Sajovec

[57] ABSTRACT

A nonvolatile integrated circuit memory includes an array of rows and columns of memory cells, with each memory cell includes a transistor having a floating gate and a control gate. The array of memory cells is divided into a plurality of memory cell strings, with the transistors in the memory cell string being serially connected. The memory also includes a plurality of word lines, a respective one of which is connected to the respective memory cell transistors in a row. Word line drivers are connected to the plurality of word lines. The word line drivers include a first word line read connection path to provide a read driving voltage to the word lines during a read operation, and a second word line write connection path to provide a write driving voltage to the word lines during a write operation. Voltages in the read path are reduced compared to voltages in a common word line read/write connection path.

9 Claims, 6 Drawing Sheets

NONVOLATILE INTEGRATED CIRCUIT MEMORIES HAVING SEPARATE READ/ WRITE PATHS

FIELD OF THE INVENTION

The present invention relates to integrated circuit nonvolatile memories, and more particularly to word line (or row line) driving circuits for nonvolatile memories.

BACKGROUND OF THE INVENTION

In order to increase the memory capacity of nonvolatile integrated circuit memories, such as Electrically Erasable and Programmable Read Only Memories (hereinafter referred to as EEPROMs), memory cell arrays with NAND structured cells have been used. An EEPROM having NAND structured cells can reduce the number of contact holes between bit lines (i.e. column lines) and memory cells, thereby increasing the memory capacity thereof.

FIG. 1 is a schematic circuit diagram showing a conventional memory cell array and a block selection circuit. A memory cell array and word line driving circuit associated with only two memory blocks MBk and MBk+1 are shown for convenience of illustration. The memory cell array may be formed in a P-type well region within an N-type well disposed in a P-type semiconductor substrate.

The memory cell array is comprised of a plurality of memory transistors arranged in a matrix configuration of rows and columns. The plurality of memory transistors are divided into a plurality of memory strings, each memory string having a predetermined number of serially-connected memory transistors. In particular, each memory string is comprised of a first selection transistor ST1, a plurality of memory transistors M1 to M16 and a second selection transistor ST2, the drain-source paths of which are connected in series with one another. Each memory transistor has a drain and a source, which are separated from one another by a channel region within the P-type well. Each memory transistor also includes a floating gate formed on a tunnel oxide film over the channel region, and a control gate formed over the floating gate on an intermediate insulating layer.

One end of each memory string, for example the drain of the first selection transistor ST1, is connected to a corresponding one of the bit lines BL1 to BLn. The other end thereof, for example the source of the second selection transistor ST2, is connected to a common source line CSL. In each memory block, gates of the first selection transistors ST1 are connected to a string selection line SSL, and gates of the second selection transistors ST2 are connected to a ground selection line GSL. Gates of the memory transistors M1 to M16 are respectively connected to corresponding word lines WL1 to WL16.

One end of the word lines WL1 to WL16 and ground selection line GSL, associated with each memory block, is respectively connected to the drains of transfer transistors T1 to T16 and TG. Gates of the transfer transistors T1 to T16 and TG are connected in common to a corresponding block selection line 11 which selects the memory block. Sources of the transfer transistors T1 to T16 and TG are respectively connected to word driving lines S1 to S16 and a ground driving line GS. The word driving lines S1 to S16 and ground driving line GS are connected to a word line driving circuit (not shown) to provide a predetermined driving voltage to each of the word driving lines S1 to S16 and ground driving line GS according to various operational modes, such as erase mode, program mode, read mode, etc.

In order to erase all memory cells within a selected memory block MBk selected by address signals, the word line driving circuit (not shown) grounds each of the word driving lines S1 to S16, and the block selection circuit 10 outputs a block selection signal BSk to turn on the transfer transistors T1 to T16 and TG within a switch circuit DTk. The transfer transistors within the switch circuits associated with unselected memory blocks are turned off by the block selection signals from their corresponding block selection circuits. Then, the word lines associated with the unselected memory blocks are allowed to electrically float.

Thereafter, an erase voltage (20 volts, for example) is applied to the P-type well. In response, electrons are emitted from the floating gates of all memory transistors within the selected memory block MBk by means of Fowler-Nordheim tunneling, causing the memory transistors within the selected memory block MBk to change into depletion mode transistors having a negative threshold voltage. On the other hand, since the word lines within unselected memory blocks all are floating, when the erase voltage is applied to the unselected memory blocks, each word line within the unselected memory blocks approaches the erase voltage by capacitive coupling, thus preventing erasure.

In order to program a specific memory cell, such as cell M2 associated with the bit line BL1 within the memory block MBk, the word line driving circuit provides a program voltage (18 volts, for example) to the word driving line S2, and a pass voltage (10 volts, for example) to the word driving lines S1 and S3 to S16. The block selection circuit 10 associated with the memory block MBk provides a pass voltage (power supply voltage Vcc, for example) to the string selection line SSL. In addition, the block selection circuit 10 provides a block selection signal BSk at the program voltage level to the block selection line so as to provide the program voltage and pass voltages to corresponding word lines through the transfer transistors within the switch circuit DTk. Ground potential is supplied to the bit line BL1 from a page buffer, and a program inhibit voltage (power supply voltage Vcc, for example) is supplied from the page buffer to each of the remaining bit lines BL2 to BLn.

Then, the transistors ST1 and M1 within the memory block MBk are turned on, and ground potential is applied to the drain and source of the memory transistor M2 associated with the bit line BL1, while the program inhibit voltage is applied to the drains and sources of the memory transistors M2 associated with bit lines BL2 to BLn. Thus, electrons are injected into the floating gate of the memory transistor M2 associated with the bit line BL1 by applying the program voltage to the control gate thereof, thereby causing the memory transistor M2 to change into an enhancement mode transistor having a positive threshold voltage. The memory transistors associated with the bit lines BL2 to BLn are not programmed due to the program inhibit voltage, so that they remain as depletion mode transistors.

In order to read data from a memory cell, such as cell M2 connected to the word line WL2 within the memory block MBk, the word line driving circuit provides ground potential to the word driving line S2 and provides the power supply voltage Vcc to each of word driving lines S1, S3 to S16 and the ground driving line GS. The block selection circuit 10 outputs the power supply voltage Vcc to the string selection line SSL associated with the selected memory block MBk, and provides the block selection signal BSk at the power supply voltage level Vcc, to the gates of the transfer transistors T1 to T16 and TG within the switch circuit DTk associated with the selected memory block MBk. Then, ground potential is supplied to the selected word line WL2 within the selected memory block MBk, and the power supply voltage level is supplied to each of the unselected word lines WL1, WL3 to WL16 and the ground selection line GSL.

Therefore, if the memory transistors M2 connected to the selected word line WL2 are depletion mode transistors (erased transistors), the bit lines connected thereto are discharged to ground potential through the common source line CSL which is at ground. However, if the memory transistors connected to the selected word line WL2 are enhancement mode transistors (programmed transistors), the bit lines connected thereto are charged to the power supply voltage Vcc. The techniques of erasing, programming and reading as described above are discussed in U.S. Pat. No. 5,473,563 to Suh et al. issued on Dec. 5, 1995 which is assigned to the assignee of the present invention, the disclosure of which is hereby incorporated herein by reference.

As described above, during the program mode of operation, a high voltage, such as a program voltage of 18 volts, is generated from charge pump circuits within the word line driving circuit and each block selection circuit, and is applied to the sources and gates of the transfer transistors T1 to T16 and TG. Thus, the word line driving circuits and block selection circuits must generally include a high voltage transistor which can withstand a high voltage at its output terminal. Each of the transfer transistors T1 to T16 and TG must also generally be a high voltage transistor which can withstand breakdown of the gate insulating layer and PN junction breakdown of source/drain thereof upon application of the high voltage.

FIG. 2 is a cross-sectional view showing a high voltage transistor according to the prior art. The high voltage transistor is formed at a surface of a P-type semiconductor substrate 12. In order to raise the PN junction breakdown voltage of the drain and source thereof, an N-type drain region 14 of relatively low concentration is separated from an N-type source region 18 of relatively low concentration by a channel region 26, and an N-type drain region 16 of relatively high concentration and an N-type source region 20 of relatively high concentration are respectively formed within the drain region 14 and the source region 18. A gate electrode 22 made of polysilicon, polycide, refractory silicide or other conductive materials, is formed on a gate insulating layer 24 over the channel region 26. In order to prevent the destruction of the gate insulating layer due to the application of the high voltage thereto, the gate insulating layer generally must have sufficient thickness, such as at least about 350 Å.

Unfortunately, the increased thickness of the gate of the high voltage transistor generally reduces the switching speed thereof. In addition, since the low concentration drain and source regions 14 and 18 are generally required to increase the PN junction breakdown voltage of the source and drain thereof, the channel generally is made long enough to prevent short-circuiting of the source and drain due to the diffusion thereof in the channel direction. The long channel generally results in a slower switching of the high voltage transistor.

Conventionally, the program cycle of an EEPROM with NAND structured cells is presently about 100-200 μsec, and the read cycle thereof is presently about 3 μsec If the read cycle of the EEPROM can be reduced to below about 100 nsec an EEPROM may be used instead of a DRAM, thus obviating the need for refreshing.

SUMMARY OF THE INVENTION

It is therefore an object of the present invention to provide a nonvolatile integrated circuit memory which can perform a read operation at high speed.

This and other objects are provided, according to the invention, by a nonvolatile integrated circuit memory which includes read operation breakdown voltage reducing means, connected to the plurality of word lines in the memory. The read operation breakdown voltage reducing means provides a read driving voltage to the word lines during a read operation, and provides a write driving voltage to the word lines during a write operation, such that voltages which need to be withstood during the read operation are reduced compared to voltages which need to be withstood during the write operation. The nonvolatile integrated circuit memory also preferably includes an array of rows of memory cells, each memory cell comprising a transistor having a floating gate and a control gate. The array of memory cells is divided into a plurality of memory cell strings, with the transistors in a memory cell string being serially connected. A respective word line is connected to the respective memory cell transistors in a row.

The read operation breakdown voltage reducing means preferably comprises a plurality of read transfer switches, a respective one of which is connected to a respective one of the plurality of word lines, to provide a read driving voltage to a selected word line, so that data is read from at least one selected memory cell during a read operation. The read operation breakdown voltage reducing means also preferably comprises a plurality of write transfer switches, a respective one of which is also connected to a respective one of the plurality of word lines, to provide a write driving voltage to a selected word line so that data can be written into at least one selected memory cell during a write operation.

The plurality of read transfer switches preferably comprise a plurality of first field effect transistors, and the plurality of write transfer switches preferably comprises a plurality of second field effect transistors. The plurality of first field effect transistors each preferably includes a source and a drain, wherein only one of the source and drain includes a relatively heavily doped portion and a relatively lightly doped portion. In the second field effect transistors, both the source and drain may include a relatively heavily doped portion and a relatively lightly doped portion. Accordingly, the first field effect transistors may be made smaller, i.e. may have a shorter channel, than the second field effect transistors, thereby speeding up the read operation relative to the write operation.

A nonvolatile integrated circuit memory according to the present invention may also be regarded as including word line driving means, connected to the plurality of word lines, and having a first word line read connection path to provide a read driving voltage to the word lines during a read operation, and having a second word line write connection path to provide a write driving voltage to the word lines during a write operation. By providing separate read and write word line driving paths, breakdown voltage of the read path is reduced compared to breakdown voltage of a common word line read/write connection path. The first word line read connection path and the second word line write connection path may also be regarded as a reading circuit, connected to the plurality of word lines, and a writing circuit which is also connected to the plurality of word lines and which is spaced apart from the reading circuit in the integrated circuit memory.

In a preferred embodiment, the first word line read connection path comprises a plurality of first field effect transistors and the second word line write connection path comprises a plurality of second field effect transistors. The first word line read connection path also includes a read driving circuit and the second word line write connection path also includes a write driving circuit. Finally, the first word line read connection path also includes a read block selection circuit and the second word line write connection path also includes a write block selection circuit.

According to the invention, two embodiments are provided for connecting the read transfer switches and the write transfer switches to the word lines in the integrated circuit. In a first embodiment, each word line includes first and second ends and a central portion, and a respective end of the read and write transfer switches is connected to a respective word line at the central portion thereof. In a second embodiment, a respective read transfer switch is connected to a respective word line at the first end thereof, and a respective write transfer switch is connected to a respective word line at the second end thereof.

By separating the read and write paths of the word line driving circuits of the nonvolatile integrated circuit memories, at least some of the read transistors need not withstand the high breakdown voltage of the write transistors. High breakdown voltage transistors are thereby not required. Accordingly, double diffused sources and drains are not required in at least some of the read path transistors. Since the double diffusion is not required, the channel length may be reduced, thereby speeding up operation of the read path transistors. By speeding up the read cycle, the overall speed of the nonvolatile integrated circuit memory may be increased.

DETAILED DESCRIPTION OF THE PREFERRED EMBODIMENT

Figure 1:
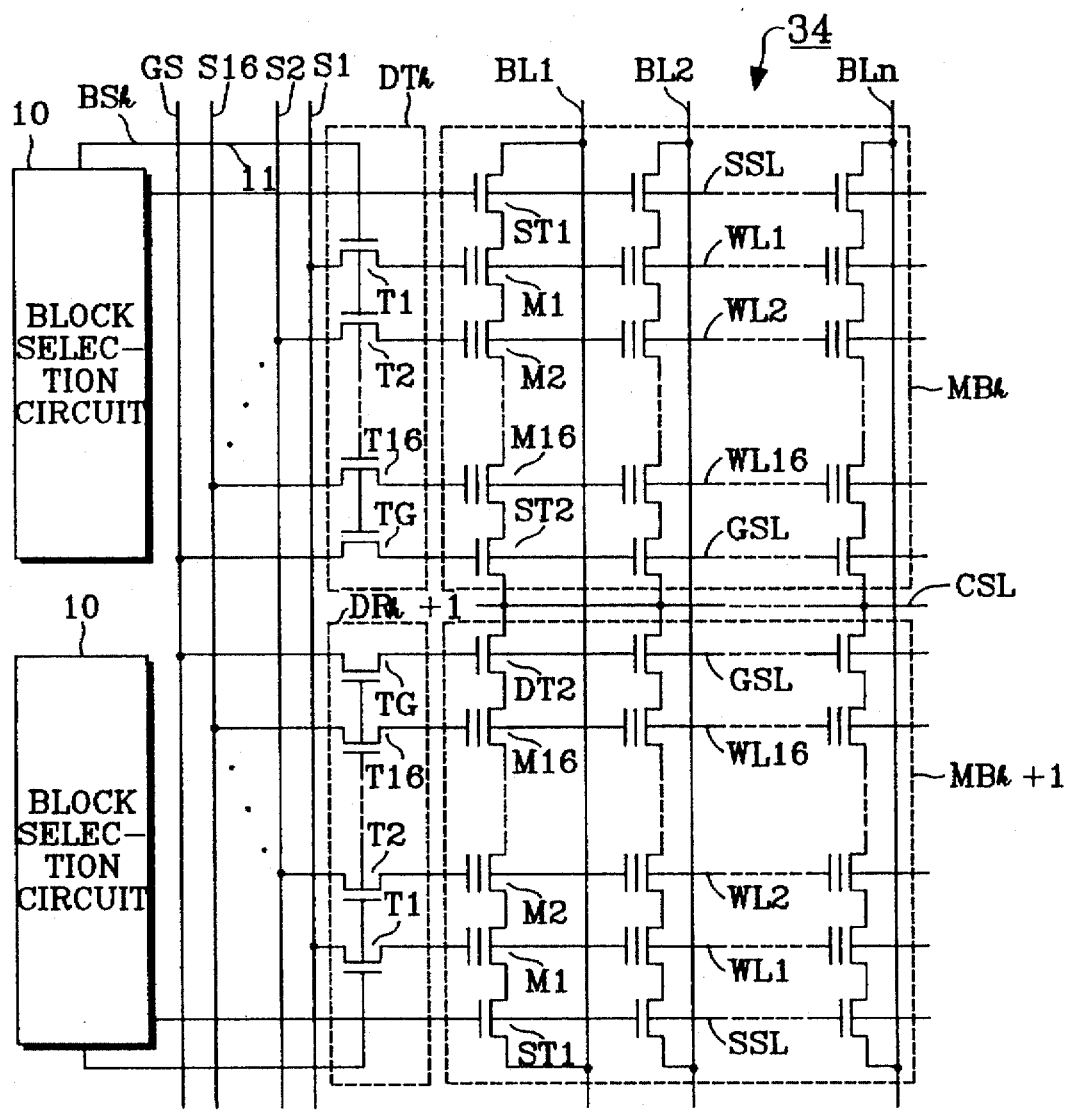
FIG. 1 is a schematic circuit diagram showing a memory cell array and a block selection circuit in a conventional nonvolatile semiconductor memory according to a prior art.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type, however, each embodiment described and illustrated herein includes its complementary embodiment as well.

Figure 3:
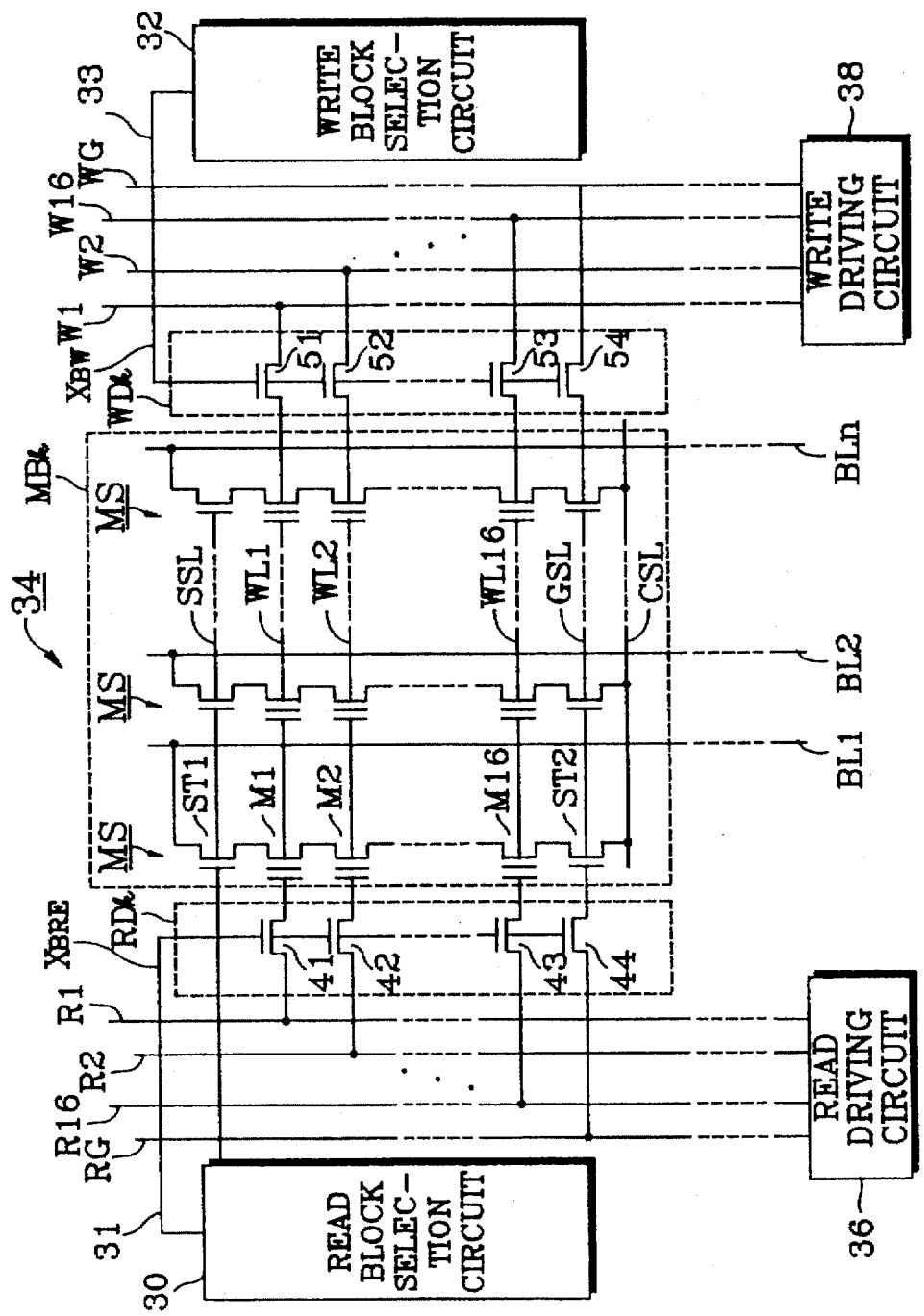
FIG. 3 is a block diagram showing a word line driving circuit having separate read/write paths according to a preferred embodiment of the present invention.

FIG. 3 shows an EEPROM having word line driving circuits with separate read/write paths according to a preferred embodiment of the present invention. The arrangement of the memory strings MS which form a memory array 34, and the arrangement of first and second selection transistors ST1 and ST2 and memory transistors M1 to M16 of each memory string, are the same as those of FIG. 1. Thus the arrangement thereof will not be discussed again.

In addition, in FIG. 3, only one memory block MBk, including of the memory strings MS arranged in a given row, is shown for convenience of illustration. However, it will be understood that there generally are a plurality of memory blocks arranged in a column direction in a memory cell array. Moreover, even though each memory string has sixteen series-connected memory transistors in FIG. 3, it will be understood that the present invention is not limited to such a specific number of the memory transistors.

The sources of read transfer gates 41 to which form a read transfer switch RDk, are respectively connected to one end of word lines WL1 to WL16 and ground selection line GSL. The drains thereof are respectively connected to read driving lines R1 to R16 and RG which are parallel to the column lines, i.e., bit lines BL1 to BLn. The gates of the read transfer gates 41 to 44 are all connected to a read block selection circuit 30. Read block selection circuit 30 generates a read selection signal $X_{BRE}$ so as to apply read driving voltages on the read driving lines R1 to R16 and RG, to the word lines WL1 to WL16 and the ground selection line GSL within a selected memory block MBk during a read operation. Read block selection circuit 30 also generates a string selection signal for turning on first selection transistors ST1 within the selected memory block MBk. In addition, the read driving lines R1 to R16 and RG are connected to a read driving circuit 36. The read transfer switches RDk are arranged in a column direction at the left side of the memory array 34 so as to correspond to each memory block MBk.

As previously described with reference to FIG. 1, the memory array 34 may be formed on a P-type well region within an N-type well at a surface of a P-type monocrystalline silicon substrate, and the read transfer gates 41 to 44 which make up each read transfer switch RDk may be formed at the surface of the P-type substrate. The read transfer switches RDk, read driving circuit 36 and read block selection circuits 30 may provide read driving means.

The sources of write transfer gates 51 to which form a write transfer switch WDk, are respectively connected to the other ends of the word lines WL1 to WL16 and ground selection line GSL. The drains thereof are respectively connected to write driving lines W1 to W16 and WG. The gates of the write transfer gates 51 to 54 are connected in common to a write block selection circuit 32. Write block selection circuit 32 generates a write block selection signal $X_{BW}$ so as to apply write driving voltages on the write driving lines W1 to W16 and WG, to the word lines WL1 to WL16 and ground selection line GSL within a selected memory block MBk during a write operation.

In addition, the write driving lines W1 to W16 and WG are connected to a write driving circuit 38. During a write operation, the write driving circuit 38 provides a program voltage, e.g., 18 volts, to the write driving line associated with a selected word line of the word lines WL1 to WL16 within the selected memory block. Write driving circuit 38 also provides a pass voltage (10 volts, for example) to the write driving lines associated with the remaining, unselected word lines. The write driving circuit 38 also supplies the power supply voltage Vcc to the write driving line WG.

The write transfer switches WDk are arranged in the column direction, on the right side of the memory array 34, so as to correspond to each memory block MBk. The write transfer switch WDk is formed on the P-type substrate in a similar manner as the read transfer switch RDk, and each of the write transfer gates 51 to 54 constituting the write transfer switch WDk may have the same construction as that of the high voltage transistor in FIG. 2. The write transfer switches WDk, write driving circuits 38 and write block selection circuits 32 may provide write driving means.

According to one aspect of the present invention, only the sources of the read transfer gates 41 to 44 connected to the word lines WL1 to WL16 and ground selection line GSL need to have double diffusion regions to be able to withstand the high voltage. In particular, FIG. 4 is a cross-sectional view showing a high voltage transistor which can be used as a read transfer gate 41 to 44.

Figure 4:
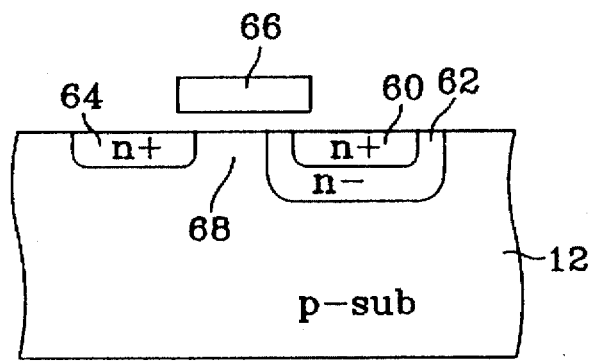
FIG. 4 is a cross-sectional view showing a high voltage transistor which may be used in the present invention.

In FIG. 4, the high voltage transistor has double diffused regions 60 and 62 on the P-type semiconductor substrate 12. The P-type semiconductor substrate 12 has an impurity concentration of about $1 \times 10^{12}$ ion/cm$^3$, and an N$^+$ region 60 connected to the ground selection line GSL and word lines WL1 to WL16 has a concentration of about $6 \times 10^{15}$ ion/cm$^3$. The N$^+$ region 60 is formed within an N$^-$ region 62 having a concentration of about $1 \times 10^{14}$ ion/cm$^3$, and the N$^-$ region 62 forms a PN junction with the P-type semiconductor substrate 12 having a concentration of about $1 \times 10^{12}$ ion/cm$^3$ in order to raise the junction breakdown voltage against the high voltage. The double diffused regions 60 and 62 constitute a source of the high voltage transistor. An N$^+$ type drain region 64 having the same concentration as the N$^+$ type region 60, is separated from the source thereof by a channel region 68. A gate electrode 66 is disposed on a gate insulating layer of about 350 Å thick over the channel region 68.

Figure 2:
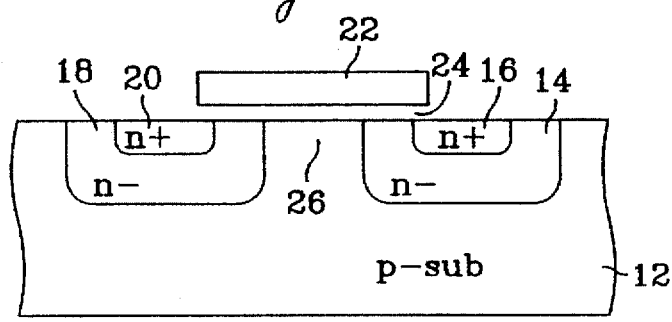
FIG. 2 is a cross-sectional view showing a conventional high voltage transistor.

As can be seen from FIG. 4, the drain only includes the N$^+$ region 64 and does not include double diffused regions, in contrast to FIG. 2. Thus, lateral diffusion only occurs at the region 62, thereby allowing reduction of channel length. Consequentially, since the channel length of the read transfer gates 41 to 44 can be reduced, the transfer speed of the read transfer gates T1 to T16 and TG may be faster than that of the prior transfer transistors.

Figure 5:
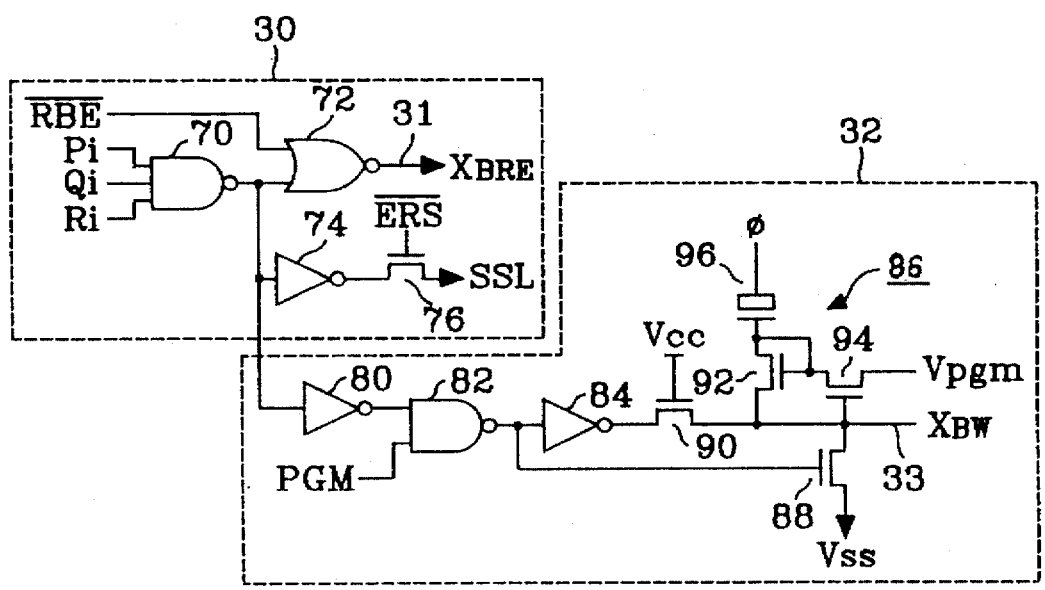
FIG. 5 is a schematic circuit diagram showing a read block selection circuit and a write block selection circuit.

FIG. 5 is a schematic circuit diagram showing an embodiment of a read block selection circuit and a write block selection circuit in FIG. 3. In FIG. 5, the read block selection circuit 30 includes a NAND gate 70, a NOR gate 72 receiving an output of the NAND gate 70 and a read control signal $\overline{RBE}$, an inverter 74 receiving the output of the NAND gate 70, and a transistor 76 passing an output of the inverter 74 to the string selection line SSL during a read operation. The NAND gate 70 receives signals Pi, Qi, and Ri which are generated by predecoding of external block selection address signals, and serves to select one of the memory blocks. The NOR gate 72 outputs to an output line 31 the read selection signal $X_{BRE}$ for activating the read transfer switch corresponding to the selected memory block during the read operation. Since a control signal $\overline{ERS}$ stays at a logic "high" level (power supply voltage Vcc) during the read operation, a unit composed of the inverter 74 and transistor 76 serves to supply the power supply voltage Vcc to the string selection line SSL within the selected memory block.

In the read block selection circuit 30, only the transistor 76 requires the high voltage transistor of FIG. 4. Conventional logic gates are used for the remaining elements, thus allowing faster reading compared with the conventional technique. It should be noted that a read block selection circuit 30 is associated with each of the memory blocks. Moreover, the read block selection circuit 30 can also be used as an erase block selection circuit during an erase operation. That is, since both the control signals $\overline{RBE}$ and $\overline{ERS}$ stay at logic "low" levels during an erase operation, the erase block selection circuit associated with the selected memory block outputs an erase selection signal $X_{BRE}$ of a power supply voltage level, and allows the string selection line SSL to float. The erase block selection circuits associated with unselected memory blocks, output erase selection signals $X_{BRE}$ at ground potential, and allow the string selection line SSL to float.

The write block selection circuit 32 includes an inverter 80 connected to the output of the NAND gate 70, a NAND gate 82 receiving an output of the inverter 80, and a program control signal PGM. An inverter 84 receives an output of the NAND gate 82. A charge pump circuit 86 is connected between the output of the inverter 84 and a write block selection output line 33. An N channel MOS transistor 88 has its drain-source path connected between output line 33 and ground Vss, and its gate is connected to the output of the NAND gate 82. The charge pump circuit 86 is a conventional circuit composed of N channel MOS transistors 90–94 and a charge pump capacitor 96. The drain-source path of the pull-down transistor 88 is connected between the line 33 and ground Vss, and the gate thereof is connected to the output of the NAND gate 82.

During a program operation, the inverter 84 of the write block selection circuit 32 associated with the selected memory block outputs a logic "high" level (e.g., power supply voltage Vcc) and the charge pump circuit 86 associated therewith serves to provide the program voltage Vpgm, e.g. 18 volts, onto the line 33 according to a clock $\phi$ output from a ring oscillator (not shown). The outputs of the NAND gates 82 associated with unselected write block selection circuits are at logic "high" levels, so that the pull-down transistors 88 are turned on. With the conduction of the pull-down transistors 88, the lines 33 associated with the unselected write block selection circuits stay at ground level. Thus, the write transfer switches connected to the unselected memory blocks maintain off states.

Figure 6A:
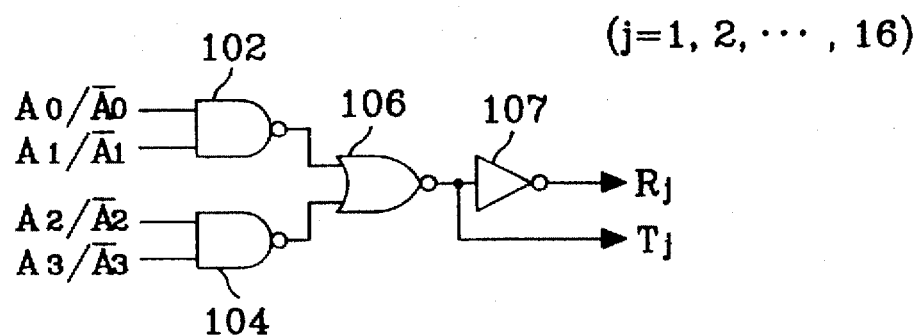
FIGS. 6A and 6B are schematic circuit diagrams showing a read driving circuit.
Figure 6B:
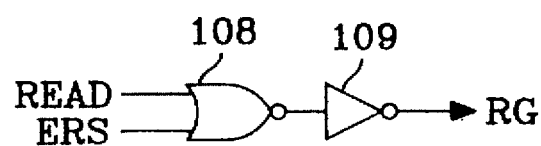

FIGS. 6A and 6B are logic circuit diagrams showing a preferred embodiment of the read driving circuit. It should be noted that seventeen read driving circuits shown in FIGS. 6A and 6B constitute the read driving circuit 36 of FIG. 3.

Referring to FIG. 6A, a NAND gate 102 receives address signals $A_0$ or $\overline{A_0}$ (complementary signal of $A_0$) and $A_1$ or $\overline{A_1}$. NAND gate 102 receives address signals $A_2$ or $\overline{A_2}$ and $A_3$ or $\overline{A_3}$. A NOR gate 106 receives outputs of the NAND gates 102 and 104. An inverter 107 inputs the output of the NOR gate 106 and the output terminal thereof is connected to a corresponding read driving line $R_j$ in FIG. 3.

During a read operation, one of sixteen word lines is selected in response to the address signals $A_0/\overline{A_0}$ to $A_3/\overline{A_3}$. The NOR gate 106 within the read driving circuit connected to the read driving line associated with the selected word line outputs a logic "high" level, and the inverter 107 thereby outputs a logic "low" level. Thus, the selected word line goes to a logic "low" level, i.e., to ground level. In contrast, during the read operation, the NOR gates 106 within the read driving circuits connected to the read driving lines associated with the unselected word lines output logic "low" levels, and thereby the inverters 107 output logic "high" levels. Thus, the unselected word lines go to logic "high" levels of 5 volts.

The read driving line RG is connected to the output terminal of an inverter 109, which receives an output of a NOR gate 108 which receives a read control signal READ and an erase control signal ERS (complementary signal of the control signal $\overline{ERS}$) as shown in FIG. 6B. A unit composed of the NOR gate 108 and inverter 109 serves to provide the power supply voltage Vcc to the read driving line RG during the read or erase operation.

Figure 7A:
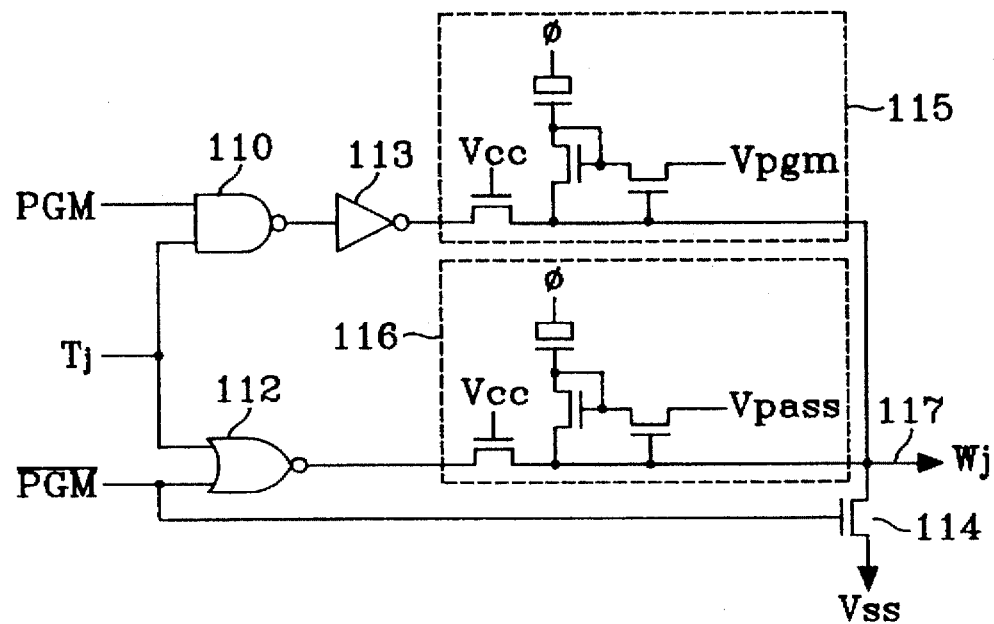
FIGS. 7A and 7B are schematic circuit diagrams showing a write driving circuit.
Figure 7B:
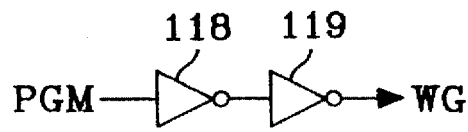

FIGS. 7A and 7B are schematic circuit diagrams showing a preferred embodiment of the write driving circuit. It will be understood that seventeen write driving circuits as shown in FIGS. 7A and 7B constitute the write driving circuit 38 in FIG. 3.

Referring to FIG. 7A, NAND gate 110 and NOR gate 112 receive an output signal Tj from the NAND gate 106 of FIG. 6 at their first input terminals, and receive a program control signal PGM and its complementary signal $\overline{PGM}$, respectively, at their second input terminals. The output of the NAND gate 110 is connected to the input terminal of an inverter 113, and a program charge pump circuit 115 for providing the program voltage Vpgm is connected between the output terminal of the inverter 113 and a write driving line 117. A pass charge pump circuit 116 for providing the pass voltage Vpass is connected between the output terminal of the NOR gate 112 and the write driving line 117.

The source-drain path of a pull-down transistor 114 is connected between the write driving line 117 and ground potential Vss, and the gate thereof is connected to the control signal $\overline{PGM}$. Thus, the program voltage Vpgm is supplied to the write driving line associated with the selected word line by activation of the program charge pump circuit 115, and the pass voltage Vpass is supplied to the write driving lines associated with the unselected word lines by activation of the pass charge pump circuits 116. As shown in FIG. 7B, a unit composed of series-connected inverters 118 and 119 provides the power supply voltage Vcc to the write driving line WG in response to the program control signal PGM.

Operation of the present invention will now be discussed in detail with reference to FIGS. 3 to 7A and 7B. During a read operation, the read driving circuit 36 provides 0 volts to the read driving line associated with a selected word line in response to the address signals $A_0/\overline{A_0}-A_3/\overline{A_3}$. At the same time, the read driving circuit 36 provides the power supply voltage Vcc to each of the read driving lines associated with the unselected word lines. For example: assuming that the word line WL2 within the memory block MBk of FIG. 3 is to be selected, the read driving circuit 36 provides 0 volts to the read driving line R2 and the power supply voltage Vcc at logic "high" level to the remaining read driving lines R1, R3 to R16 and RG. The read block selection circuit 30 supplies the read selection signal $X_{BRE}$ for selecting the memory block MBk and the string selection signal to the string selection line SSL in response to the block selection address signals Pi, Qi and Ri.

Therefore, the read transfer gates 41 to 44 which form the read transfer switch RDk associated with the selected memory block MBk are turned on. The voltages on the read driving lines R1 to R16 and, RG, and the string selection signal, are applied to the word lines W1 to W16, ground selection line GSL and string selection line SSL within the memory block MBk. Thereby, the first and second selection transistors ST1 and ST2 and the memory transistors M1 and M3 to M16 associated with the word lines W1 and W3 to W16 are turned on. In contrast, since the read voltage of 0 volts is applied to the control gates of the memory transistors M2 connected to the word line W2, the memory transistors M2 which had been programmed to depletion modes are turned on. The bit lines connected to the depletion mode memory transistors M2 are thereby discharged to the voltage on the grounded common source line. However, the memory transistors which had been programmed to enhancement mode are turned off, and thereby maintain charging voltages on their corresponding bit lines. Thereafter, the voltage states of the bit lines BL1 to BLn are detected and read out. Consequently, the read driving circuit 36 and read block selection circuit 30 do not employ high voltage transistors, except for the read transfer gates 41 to 44, thereby providing a high speed read operation.

A program operation is performed as will be described hereinbelow. During the program operation, the read transfer switch RDk associated with each memory block maintains an off state, and the power supply voltage Vcc is applied from the read block selection circuit 30 to the string selection line SSL associated with the selected memory block. During the program operation, the write driving circuit 38 provides the program voltage Vpgm onto a given write driving line associated with one word line selected by the address signals $A_0/\overline{A_0}$ to $A_3/\overline{A_3}$, and the pass voltage Vpass is provided to the remaining write driving lines associated with the unselected word lines.

Thereafter, the write block selection circuit 32 associated with the selected memory block provides the write block selection signal $X_{BW}$ at a program voltage level, thereby turning on the write transfer switch WDk associated with the selected memory block. Thus, the program voltage Vpgm is supplied to the selected word line, and the pass voltage Vpass is applied to the unselected word lines. Simultaneously, 0 volts are applied from a page buffer (not shown) to the bit lines associated with the memory cells to be programmed. The program inhibit voltage, e.g. the power supply voltage Vcc, is applied from the page buffer to the bit lines associated with the memory cells to be program inhibited. Therefore, the memory cells to be programmed by the program voltage on the selected word line are changed to enhancement mode transistors, whereas the memory cells to be program inhibited maintain the erased states of depletion mode transistors. Such a program operation is discussed in detail in the aforementioned U.S. Pat. No. 5,473,563.

The erase operation is performed by providing the block selection signal $X_{BRE}$ at power supply voltage Vcc level and a floating string selection signal from the read block selection circuit 30 associated with the selected memory block, to the lines 31 and to the string selection line SSL respectively. Ground potential is applied by the read driving circuit 36 to the read driving lines R1~R16 and RG. When the erase voltage of about 20 volts is applied to the semiconductor substrate, the memory cells M1 to M16 within the selected memory block are then all erased as described above. However, since the word lines WL1 to WL1 6 within the unselected memory blocks are all floating, the memory cells within the unselected memory blocks are automatically prevented from erasing by the capacitive coupling of the erase voltage to the floating word lines. Such an erase operation is also disclosed in the above-mentioned U.S. Pat. No. 5,473,563.

Figure 8:
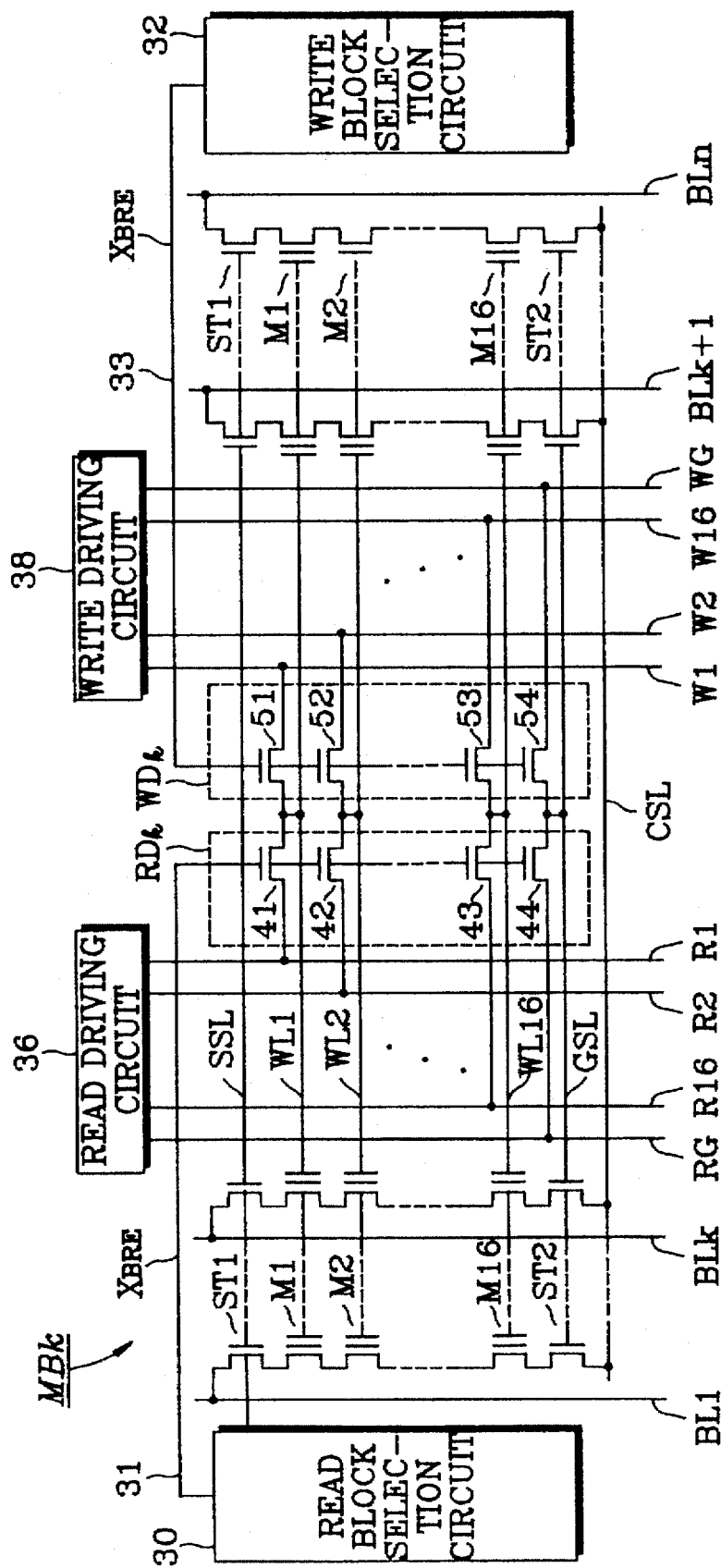
FIG. 8 is a block diagram showing a word line driving circuit having separate read/write paths according to another preferred embodiment of the present invention.

FIG. 8 is a block diagram showing a word line driving circuit having separate read/write paths according to another preferred embodiment of the present invention. A difference between FIG. 3 and FIG. 8 is that in FIG. 8, the read transfer switch RDk and write transfer switch WDk are located at the center portion of the memory block MBk. Also in FIG. 8, the sources of the read transfer gates 41 to 44 are connected to corresponding sources of the write transfer gates 51 to 54, and the sources of the read transfer gates 41 to 44 and write transfer gates 51 to 54 are commonly connected to corresponding word lines WL1 to WL16 and ground selection line GSL. Since the read driving voltage and program driving voltage are applied from center portions of the word lines, these voltages may be quickly transferred, and voltage drops of driving voltages between those portions and the memory strings located at both end portions of the memory array may be reduced.

While there has been illustrated and described what is considered to be preferred embodiment of the present invention, it will be understood by those skilled in the art that various changes and modifications may be made without departing from the scope of the present invention. For example, the read transfer switch RDk and write transfer switch WDk may be placed at a central portion of each memory cell array having divided word lines. Further, the string selection signal which is applied to the string selection line may not be provided from the read block selection circuit 30. In this case, each string selection line may be connected to a separate read driving line via a read transfer gate, and the gate of the read transfer gate may be connected to the read block selection signal $X_{BRE}$ output from the read block selection 30.

As described above, since high voltage transistors need not be used during decoding of the read operation, the read operation may occur at a higher speed compared with the prior art. In addition, in a memory cell array having long word lines, the read transfer switches and write transfer switches can be placed in predetermined portions of the memory cell array, making it possible to provide substantially uniform driving voltages onto the word lines.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A nonvolatile integrated circuit memory comprising:
an array of rows and columns of memory cells, each memory cell comprising a transistor having a floating gate and a control gate;
a plurality of word lines, a respective one of which is connected to the respective memory cell transistors in a row of the array;
a plurality of read transfer switches associated with the array, a respective one of which is connected to a respective one of the plurality of word lines of the array, to provide a read driving voltage to a selected word line of the array so that data is read from at least one selected memory cell of the array during a read operation; and
a plurality of write transfer switches associated with the array, a respective one of which is also connected to a respective one of the plurality of word lines of the array, to provide a write driving voltage to a selected word line of the array so that data can be written into at least one selected memory cell of the array during a write operation;
wherein said plurality of read transfer switches associated with the array comprise a plurality of first field effect transistors, and wherein said plurality of write transfer switches associated with the array comprise a plurality of second field effect transistors;
wherein said plurality of first field effect transistors each includes a source and a drain, wherein only one of the source and drain includes a relatively heavily doped portion and a relatively lightly doped portion; and
wherein said plurality of second field effect transistors each includes a source and a drain, wherein both the source and drain include a relatively heavily doped portion and a relatively lightly doped portion.

2. A nonvolatile integrated circuit memory according to claim 1 wherein each of said word lines of the array includes first and second ends and a central portion, and wherein a respective one of said read and write transfer switches is connected to a respective word line of the array at the central portion thereof.

3. A nonvolatile integrated circuit memory according to claim 1 wherein each of said word lines of the array includes first and second ends and a central portion, wherein a respective read transfer switch is connected to a respective word line of the array at the first end thereof, and wherein a respective write transfer switch is connected to a respective word line of the array at the second end thereof.

4. A nonvolatile integrated circuit memory according to claim 1 further comprising a read driving circuit associated with the array connected to said plurality of read transfer switches associated with the array, and a write driving circuit associated with the array connected to said plurality of write transfer switches associated with the array.

5. A nonvolatile integrated circuit memory according to claim 4 further comprising a read block selection circuit associated with the array connected to said plurality of read transfer switches associated with the array, and a write block selection circuit associated with the array connected to said plurality of write transfer switches associated with the array.

6. A nonvolatile integrated circuit memory according to claim 1 wherein said array of memory cells is divided into a plurality of memory cell strings, with the transistors in a memory cell string being serially connected to one another.

7. A nonvolatile integrated circuit memory comprising:
an array of rows and columns of memory cells, each memory cell comprising a transistor having a floating gate and a control gate, said array of memory cells being divided into a plurality of memory cell strings, with the transistors in a memory cell string being serially connected;
a plurality of word lines associated with the array, a respective one of which is connected to the respective memory cell transistors in a row of the array;
a reading circuit associated with the array, connected to the plurality of word lines of the array, to provide a read driving voltage to the word lines so that data is read from at least one selected memory cell during a read operation; and
a writing circuit associated with the array which is also connected to the plurality of word lines of the array separately from the reading circuit, to provide a write driving voltage to the word lines of the array so that data is written into at least one selected memory cell during a write operation;
wherein said reading circuit associated with the array comprises a plurality of read transfer switches, a respective one of which is connected to a respective one of the plurality of word lines of the array, to provide a read driving voltage to a selected word line of the array so that data is read from at least one selected memory cell of the array during a read operation:
wherein said writing circuit associated with the array comprises a plurality of write transfer switches, a respective one of which is also connected to a respective one of the plurality of word lines of the array, to provide a write driving voltage to a selected word line of the array so that data is written into at least one selected memory cell of the array during a write operation;

wherein said plurality of read transfer switches associated with the array comprise a plurality of first field effect transistors, and wherein said plurality of write transfer switches associated with the array comprise a plurality of second field effect transistors;

wherein said plurality of first field effect transistors each includes a source and a drain, wherein only one of the source and drain includes a relatively heavily doped portion and a relatively lightly doped portion; and wherein said plurality of second field effect transistors each includes a source and a drain, wherein both the source and drain include a relatively heavily doped portion and a relatively lightly doped portion.

8. A nonvolatile integrated circuit memory according to claim 7 wherein said reading circuit further comprises a read driving circuit; and wherein said writing circuit further comprises a write driving circuit.

9. A nonvolatile integrated circuit memory according to claim 8 wherein said reading circuit further comprises a read block selection circuit; and wherein said writing circuit further comprises a write block selection circuit connected to said plurality of write transfer switches.

* * * * *